(12) United States Patent
Sasaki (10) Patent No.: US 6,617,506 B2
(45) Date of Patent: Sep. 9, 2003

(54) POWER GENERATION EQUIPMENT USING SUNLIGHT

(75) Inventor: Ikuji Sasaki, Misato (JP)

(73) Assignee: Keiji Sasaki, Tokyo (JP)

( * ) Notice: Subject to any disclaimer, the term of this patent is extended or adjusted under 35 U.S.C. 154(b) by 0 days.

(21) Appl. No.: 10/077,812

(22) Filed: Feb. 20, 2002

(65) Prior Publication Data

US 2002/0139413 A1 Oct. 3, 2002

(30) Foreign Application Priority Data

Mar. 29, 2001 (JP) ........................................ 2001-095542

(51) Int. Cl.[7] ............................................. H01L 31/052
(52) U.S. Cl. ........................ 136/246; 136/259; 126/576; 126/577; 126/605; 126/606; 126/607; 250/203.4
(58) Field of Search ................................. 136/246, 259; 126/576, 577, 605, 606, 607; 250/203.4

(56) References Cited

U.S. PATENT DOCUMENTS

| | | | | |
|---|---|---|---|---|
| 4,172,739 A | * | 10/1979 | Tassan | 136/246 |
| 4,285,567 A | * | 8/1981 | Hansen | 126/600 |
| 5,632,823 A | * | 5/1997 | Sharan | 136/246 |
| 6,005,236 A | * | 12/1999 | Phelan et al. | 250/203.4 |
| 6,239,353 B1 | * | 5/2001 | Hall et al. | 136/246 |
| 6,284,968 B1 | * | 9/2001 | Niesyn | 136/246 |
| 6,465,725 B1 | * | 10/2002 | Shibata et al. | 136/246 |

FOREIGN PATENT DOCUMENTS

| | | | |
|---|---|---|---|
| JP | 6-301420 | * | 10/1994 |
| JP | 2001-102613 | * | 4/2001 |

* cited by examiner

Primary Examiner—Alan Diamond
(74) Attorney, Agent, or Firm—Ronald E. Greigg (57) ABSTRACT

Power generation equipment using sunlight, allowing a solar cell panel to follow and rotate at a required time to follow a movement of the sun and allowing a level support base to rotate slowly at a required time so as to adapt a direction and time of the sun, comprises a level support base provided fixedly at the center support member provided on a base; a solar cell panel provided rotatably at the level support base through a horizontal axle; a set of deceleration gears interposed between a following gear 16 provided at the horizontal axle to move the solar cell panel and a drive gear 18 provided at an output axle of a first drive motor for the panel; a set of second deceleration gears interposed between a second gear which is provided at the center support member and a second drive gear provided at a drive axle of a second drive motor for the level support stand; means for controlling the first and second drive motors and further including a function for controlling an inclination of the panel.

3 Claims, 12 Drawing Sheets

POWER GENERATION EQUIPMENT USING SUNLIGHT

BACKGROUND OF THE INVENTION

The present invention relates to power generation equipment using sunlight, and more particularly having a solar cell panel which rotates according to motion of the sun.

The power generation equipment may catch sunlight efficiently by the solar panel and may raise power generation efficiency "sunlight chasing equipment". For example, the embodiment indicated by Japanese Patent Application Laid-Open No. 6-301420 is an example of this kind of power generation equipment. An end part of the solar panel in this embodiment is supported rotatably by a horizontal rotation axle, other ends are connected with a projection tip part of an operation lever of a perpendicular cylinder. Operation liquid is provided in a heating chamber arranged under a mount which enters into the perpendicular cylinder. Inner pressure of the perpendicular cylinder corresponds to the pressure of the operation liquid that expands in response to the radiant heat of the sunlight. Therefore, if the pressure of the operation liquid increases, the inner pressure of the perpendicular cylinder will increase and the perpendicular cylinder will elongate. Also, the solar panel rotates at a fulcrum from a level state to an inclined state.

However, since the stroke of a piston rod as the operation lever is not adequate, a solar panel may only rotate at a very narrow angle. Moreover, since the radiant heat of the sunlight changes by the sun, the solar panel may not follow and rotate by the sun correctly.

SUMMARY OF THE INVENTION

The first object of the present invention is to provide a solar cell panel fully utilizable until the sun rises in the east and sets to the west. The second object is to provide a solar cell panel directed toward the sun (especially south) and to follow the sun changing to a supine state slowly. The third object of this invention is to be usable at any season. The fourth object is to offer the equipment with durability and save on parts as much as possible. The fifth object is to be able to allow a level support stand to support the equipment while rotating smoothly. The sixth object is to be able to discontinue use of the solar cell panel and the level support stand at night and save power.

DETAILED DESCRIPTION OF THE PREFERRED EMBODIMENTS

An example of the power generation equipment X of the present invention is explained. The equipment is made up of a base 1 such as a support stand, a mount, or a floor. In this embodiment, the base is a box-shaped support stand usable with a control device.

A plurality of support members 6 are supported on the base 1 to support the circumferential end of a level support stand 4, the support members 6 including a spherical support roller 7 suitably supported pivotably at the upper end thereof. The support roller 7 is supporting the circumferential end of the level support stand 4 with sufficient balance. The eight-support members 6,7 are arranged around a central support member 2 at a fixed interval. The central support member has a second gear 3 oriented parallel to the base 1. The gear may be positioned fixedly between a lower support 2a fixed to the base 1 and an upper support 2b fixed to the level support stand 4. In addition, an upper end of upper support 2b is fixed to the level support stand 4 through the fixture 5.

Figure 1:
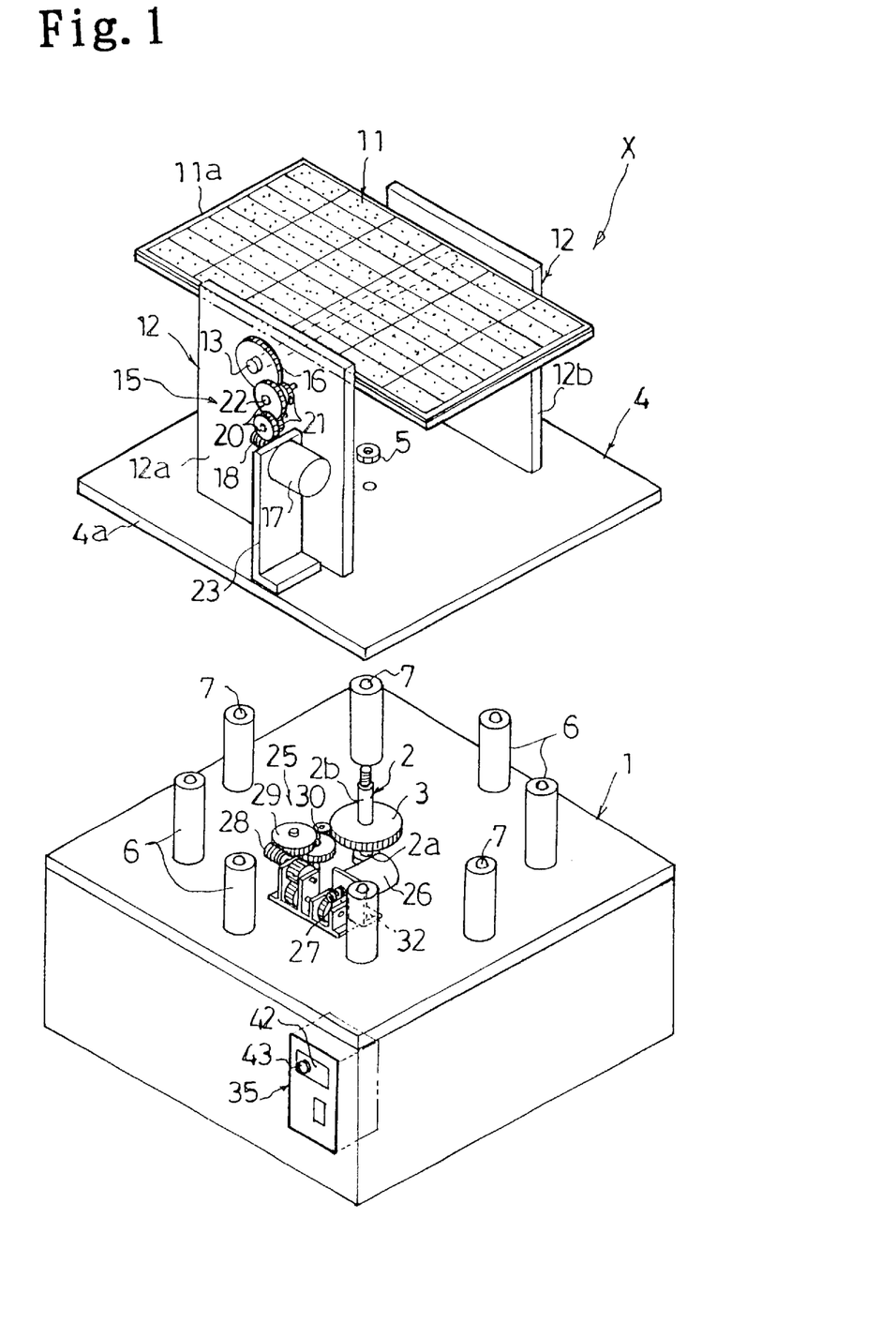
FIG. 1 is a solar cell panel in a level state.
Figure 2:
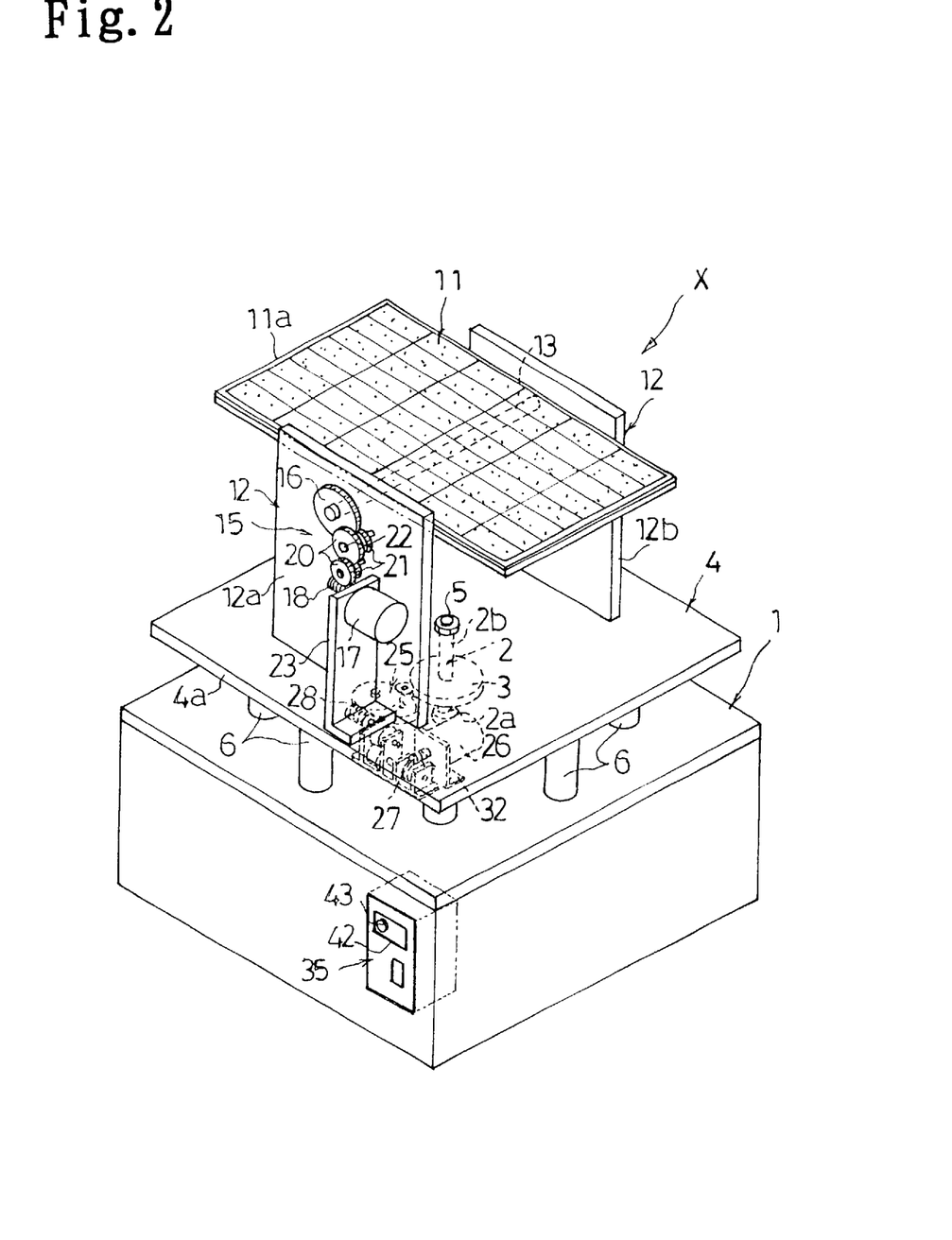
FIG. 2 is an exploded view of the solar panel.

A solar cell panel 11 is provided rotatably through a horizontal axle 13 supported rotatably between a pair of perpendicular boards 12 for receiving the axle (here, the forward side wall is numbered by 12a and the backward side wall is numbered by 12b) fixed to the upper surface of the level support stand 4. The solar cell panel 11 is formed as a longwise rectangle board, as illustrated in FIG. 1, fixed to the horizontal axle 13 formed in the shape of a pipe at the central part thereof. Although it is not illustrated specifically, the electricity generated by the solar cell panel 11 is supplied into a constant voltage equipment, a storage battery, etc. through an electric supply line which passes through the other end of the horizontal axle 13, a through hole provided at the board 12, a central hole provided adjacent the central part of the level support stand 4, the electricity is used as stabilized electric power.

A set of first deceleration gears 15 are disposed between a first gear 16 provided in the end part of the horizontal axle 13 and a first drive gear 18 provided in the output axle of a first drive motor 17 for the panel to allow the solar cell panel 11 to move. Each gear 20 and 21 of the first deceleration gears 15 is supported rotatably through a plurality of horizontal axles 22 by the forward perpendicular board 12a (left board in FIG. 3).

The speed of the first drive motor 17 or gear ratio of the deceleration gear 15 can be designed arbitrarily. In this embodiment, it is set up so that a lower end 11a of the solar cell panel 11 may be in a level state from a perpendicular state on "the basis of about 6 hours". Moreover, if the drive axle of the first drive motor 17 reverse-rotates by the control means as based at noon (12:00 p.m.), it is set up so that it may return to the position of the original lower part at "for example, six hours (6:00 p.m.)".

A support board 23 with an L-shaped end for the drive motor is fixed to the outer wall of the perpendicular board 12a and the upper surface of the level support stand 4. The first drive motor 17 is attached in the upper end of this support board 23 at the transverse direction.

A set of second deceleration gears 25 are disposed between the second gear 3 of the support member 2 and the second drive gear 27 provided in a drive axle of a second drive motor 26 for the level support stand so as to allow the level support stand 4 to rotate.

Figure 3:
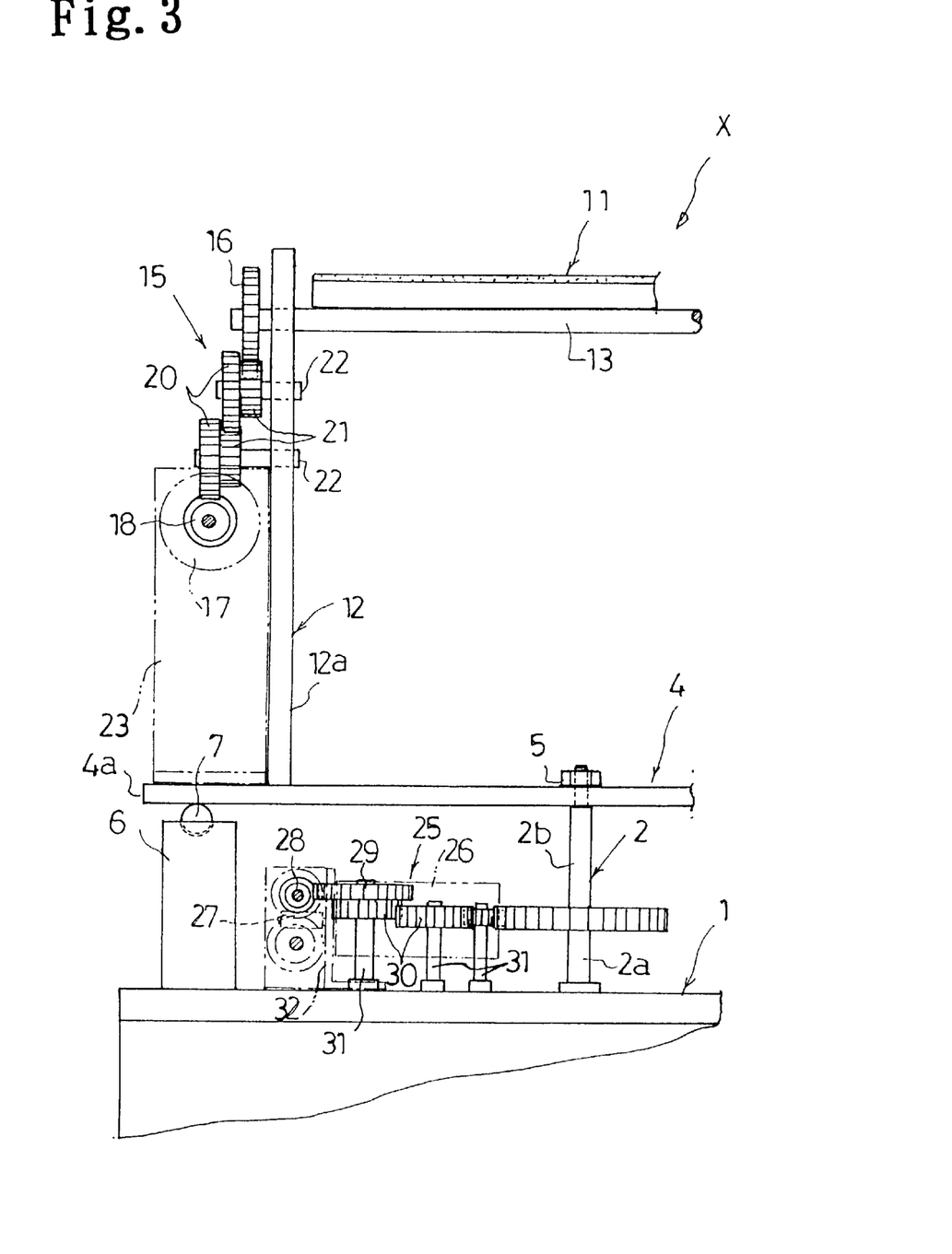
FIG. 3 is a schematic explanation view of the equipment.

The second deceleration gears 25 include a worm wheel 28 and large and small gears 29, 30 which are provided on the top of the base 1 or support board 32 through a plurality of axles 31 (see FIG. 3).

The gear ratio of the second drive motor 26 and deceleration gear set 25 can be designed arbitrarily. In this embodiment, it is set so as to rotate one rotation at twenty-four hours at the same speed as the rotation of the earth. Therefore, the level support stand 4 rotates at 180 degrees as "based on twelve hours". Moreover, the drive axle of the second drive motor 26 reverse-rotates by the control means as based at evening time (6:00 p.m.) at high speed, and it is set up so that it may return to the original position.

Figure 4:
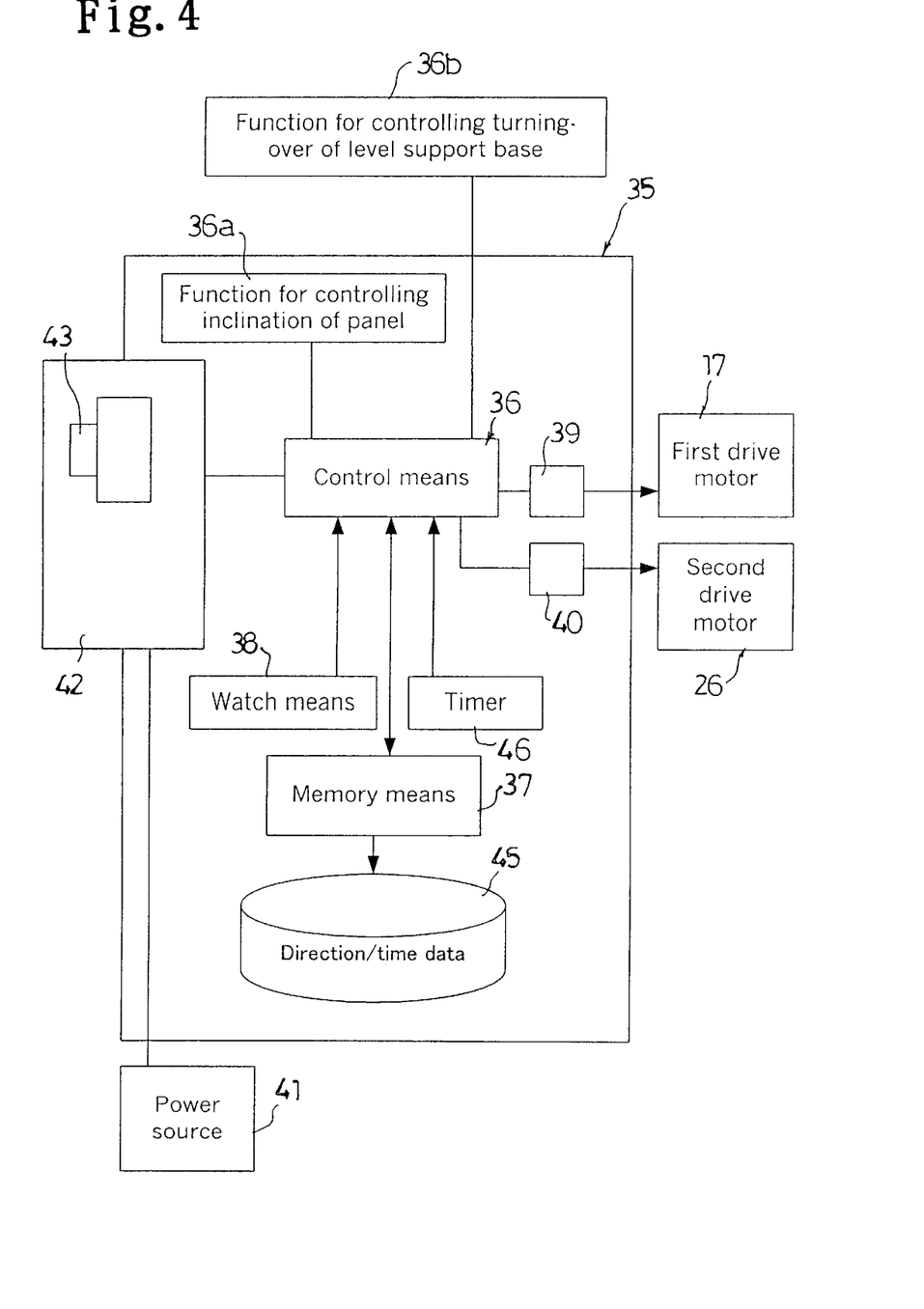
FIGS. 4 and 5 flow charts of an operation state.
Figure 5:
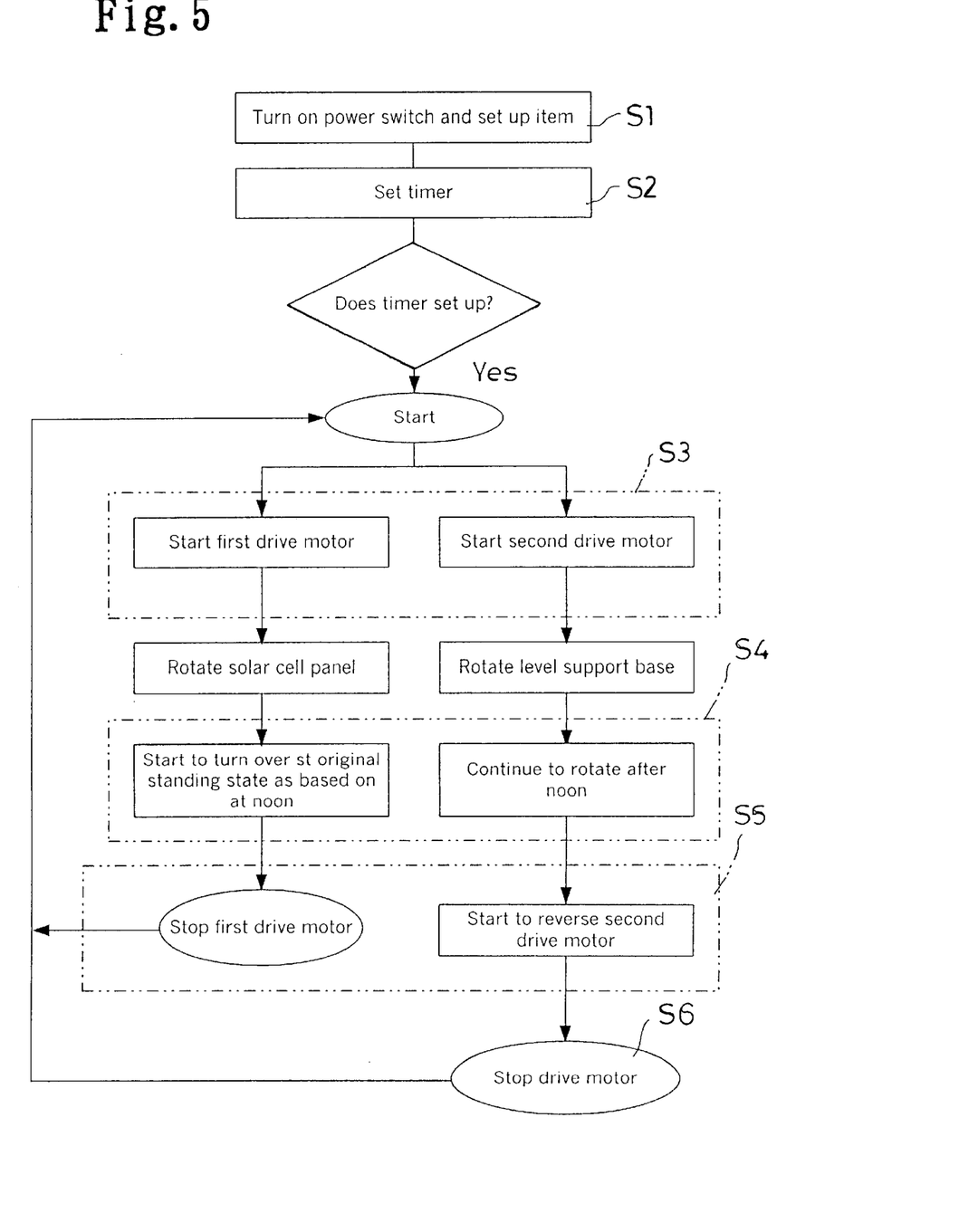

A control board 35 is attached to the base 1. As shown in FIG. 4, a control means 36, memory means 37, watch means 38 to count the time and a plurality of switch circuits 39, 40, etc. are provided in the control board 35. These means or circuits are required in order to allow the solar cell panel 11 of this invention to incline and to rotate positive and reverse rotation of the level support stand 4. A power supply 41 is provided. An input means 42 is installed into the control board 35, and the input means 42 includes a main power source switch 43.

The memory means 37 is connected electrically to the control means 36, having a direction and time data 45 which is stores data for the direction and time of the sun during a predetermined period of time (for example, every week, every month, or every predetermined days). In addition, a timer is provided.

The control means 36 for the first and drive motors further includes a function 36a for controlling an inclination of the panel, returning the panel to a downward direction as based at noon after a lower part 11a of the solar cell panel 11 is raised to a level state, in case of an optional degree within approximately 90 degrees; and a function 36b for controlling a turning-over of the level support base 4, returning the level support base 4 to an original position after the level support base 4 is rotated, in the case of an optional degree within approximately 180 degrees, allowing the solar cell panel 11 to follow and rotate at a required time so as to chase a movement of the sun and allowing the level support base 4 to rotate slowly at a required time so as to adapt a direction and time of the sun.

The action is explained by reference in FIGS. 5 to 11. The power source 41 is turned ON at first, and the various buttons of the input means 42 are operated and the date, time, sign, etc. are set up and inputted (S1). Since the date, time, rotation angle, direction etc. is prepared with various indication forms corresponding to the country and area, the user chooses optionally the rotation angle and direction, etc. which adjusts to the concerned area in the indicated forms of the "dialog box" which is not illustrated.

Figure 6:
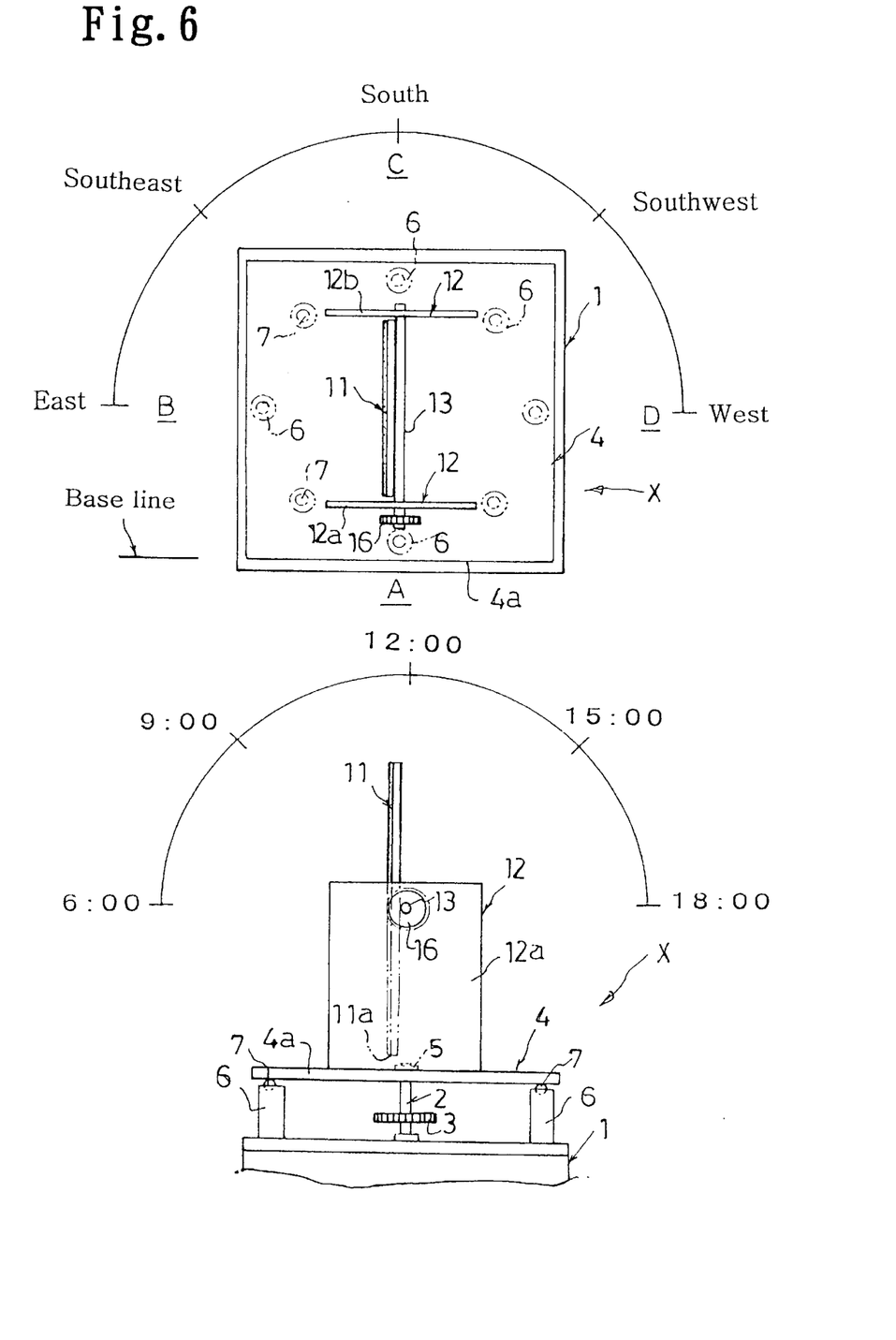
FIG. 6 is an explanation view (early state) of the way in which the solar cell panel turns to a direction of B (east: left side), and the level support board turns to a direction of A (north: front)

Next, the timer 46 is set (S2). Since the sunrise and sunset, time, and daylight hours change due to the season or area, an operator sets the starting time of the two drive motors 17 and 26 at sunrise (S3). An example of the start time for "east and at 6:00 a.m." is explained. In FIG. 6, the tip part 4a of the level support board 4 faces a direction of A (north: front), and the solar cell panel 11 faces a direction of B (east: left side). In this case, since the lower end 11a of the solar cell panel 11 is located just under, it sets as "the timer is started at 6:00 a.m.".

Then, if it is at 6:00 a.m. in the morning, the control means 36 acts on the first and second switch circuits 39 and 40 to turn them "ON". Therefore, the first and second drive motors 17 and 26 are started.

Figure 7:
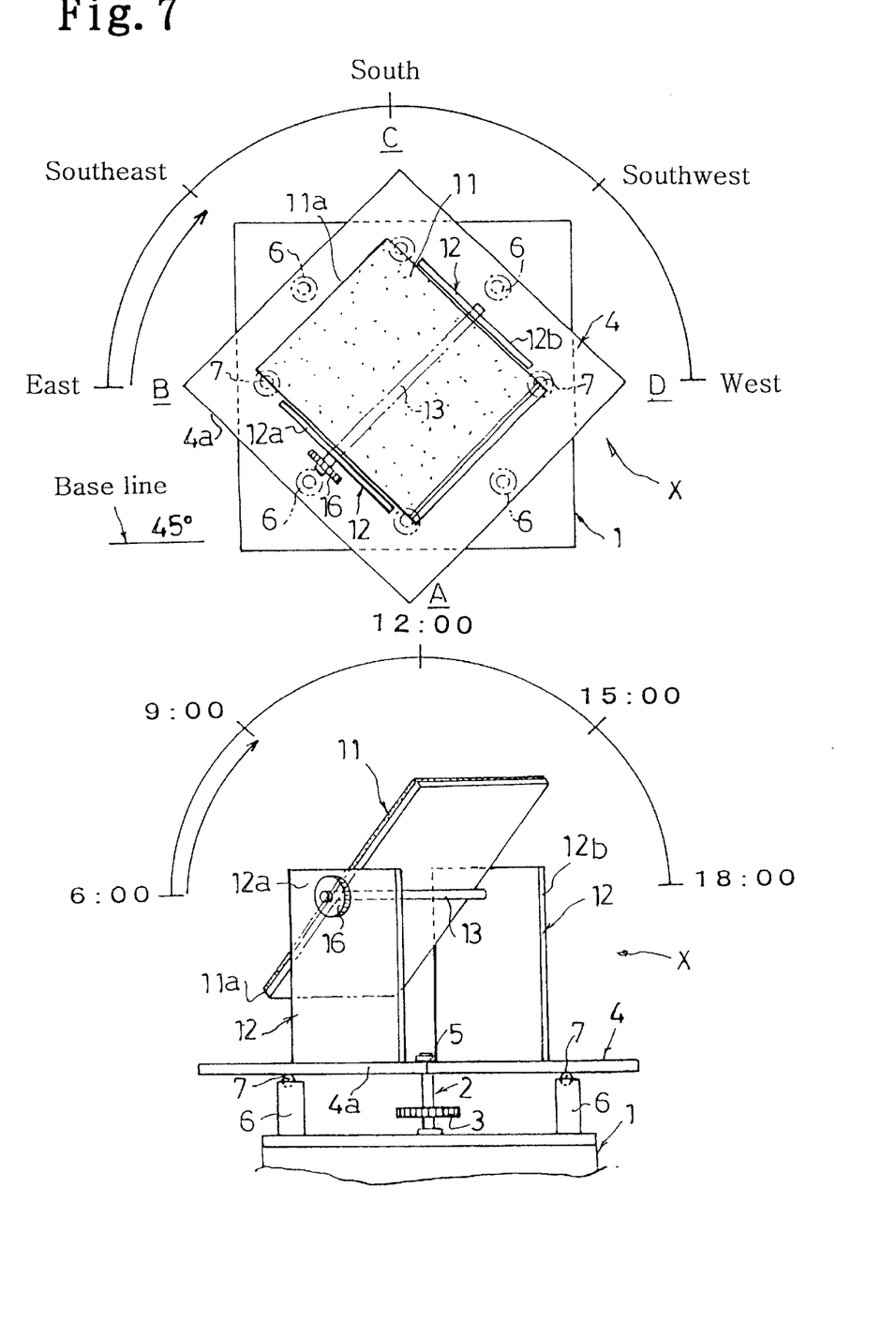
FIG. 7 is an explanation view showing the position of the level support stand and solar cell panel after three hours.

FIG. 7 illustrates a position of the level support stand 4 and the solar cell panel 11 after three hours, that is, 9:00 a.m. As illustrated in FIG. 7, the solar cell panel 11 inclines about 45 degrees in the supine state through the first deceleration gears 15 by the driving force of the first drive motor 17. Moreover, the level support stand 4 is rotating to about 45 degrees through the second deceleration gears 25 by the driving force of the second drive motor 26.

In this way, the sun rises, at the same time the solar cell panel 11 chases the sun, becoming supine slowly, the level support stand 4 rotates to the direction of the sun.

Figure 8:
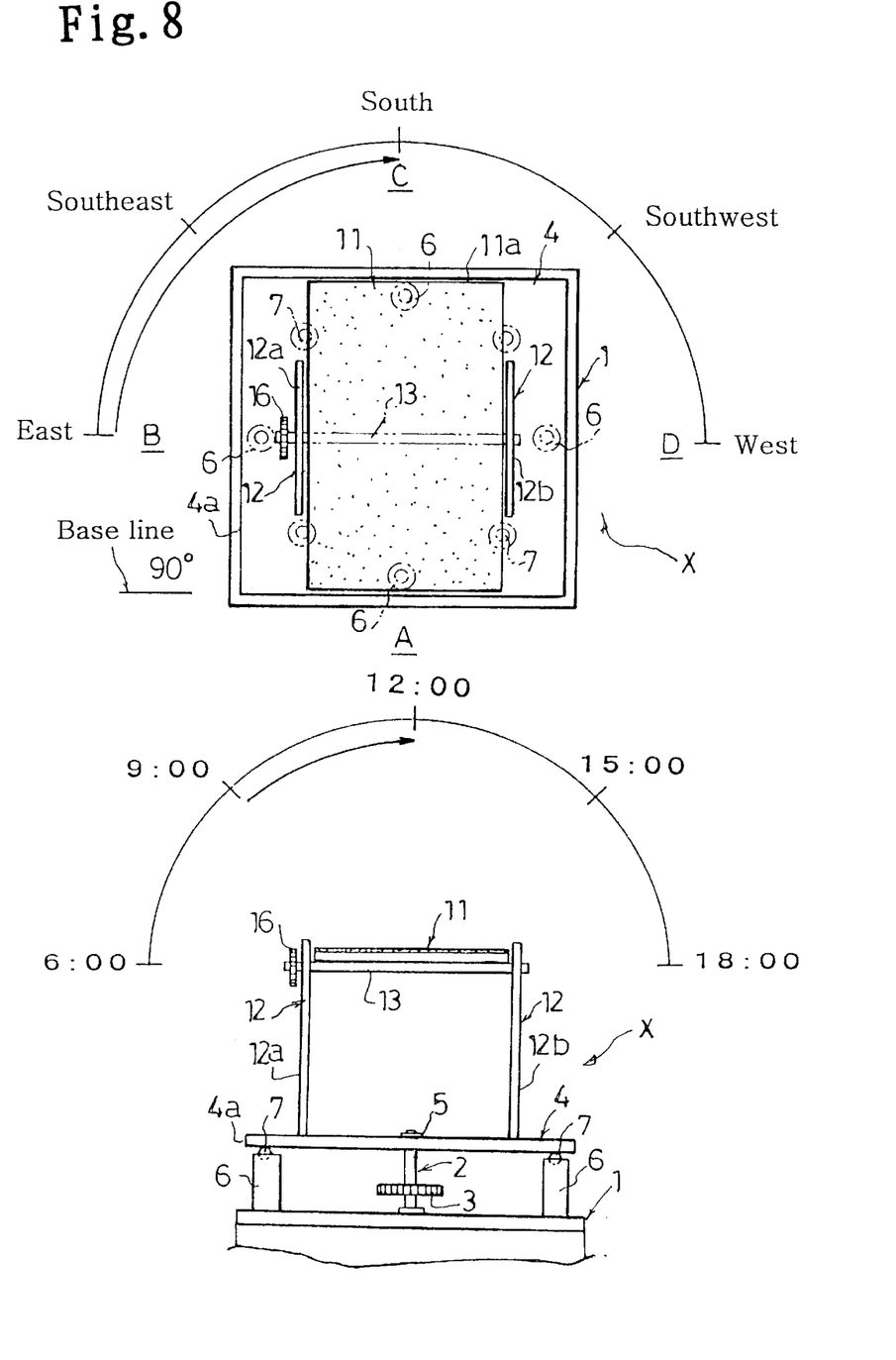
FIG. 8 is an explanation view showing the position of the solar cell panel and a level support stand at noon.

FIG. 8 illustrates the position of the solar cell panel 11 and the level support stand 4 at noon (12:00 a.m.). The solar cell panel 11 will be in the state where it is inclined, and the level support stand 4 is rotated to about 90 degrees. At noon, the control means 36 allows the first drive motor 17 to reverse through the first switch circuit 39, on the other hand, the second drive motor 26 maintains a rotation state (S4). In addition, at the time of noon, the lower end 11a of the solar cell panel 11 is located in C (south, back), and the tip part 4a of the level support stand 4 is located in B (east, left side).

The sun sets in the west when it passes lunchtime. Then, the solar cell panel 11 of this embodiment continues pursuing the sun efficiently. That is, the solar cell panel 11 which once lay down in the supine state begins (it begins to go down from the lower end 11a) to occur slowly after noon.

Figure 9:
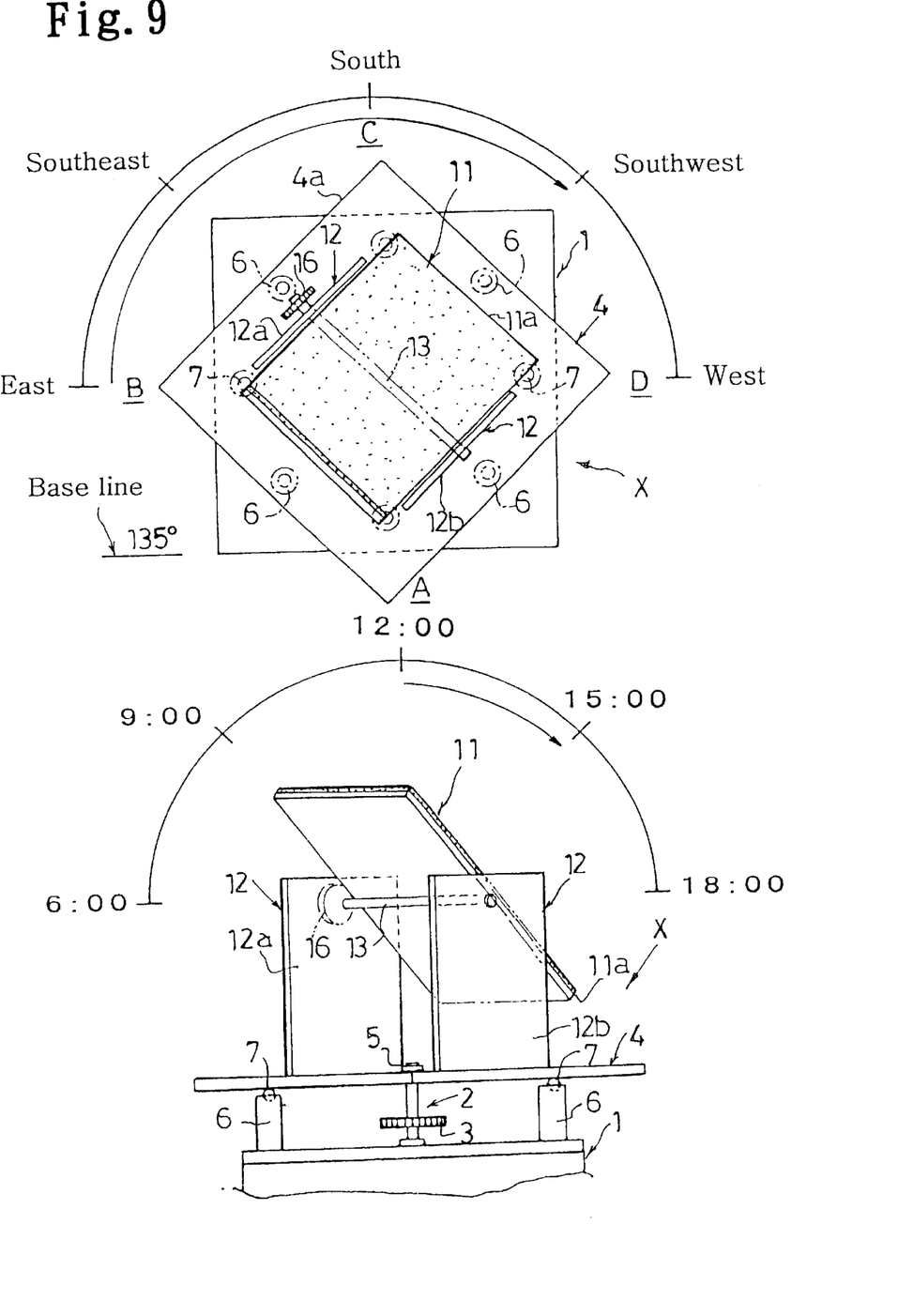
FIG. 9 is an explanation view showing the position of a level support stand and solar cell panel at 3:00 p.m.

FIG. 9 illustrates the position of the solar cell panel 11 and the level support stand 4 at 3:00 p.m. At this time, the solar cell panel 11 turns over at the same time that it turns to the southwest, the level support stand 4 rotates to 135 degrees, and the tip part 4a turns to the southeast.

Figure 10:
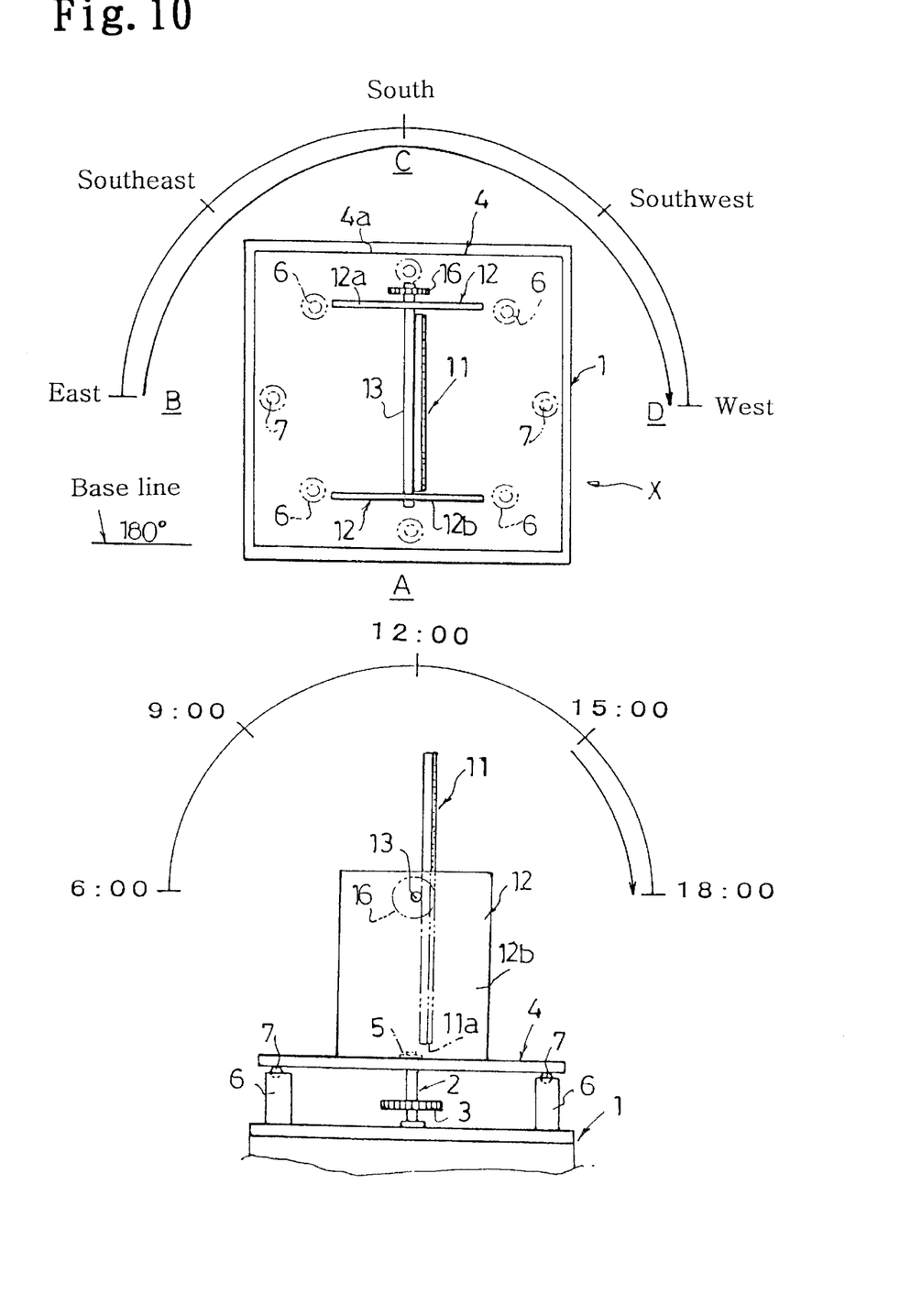
FIG. 10 is schematic explanation view showing the position of a level support stand and the solar cell panel at 6:00 p.m.

FIG. 10 illustrates the position of the solar cell panel 11 and the level support stand 4 at 6:00 p.m. At this time, the solar cell panel 11 becomes perpendicular with respect to where west. Moreover, the level support stand 4 rotates to 180 degrees, and the tip part 4a therefore has turned to the south. When it is set at 6:00 p.m., the control means 36 allows the second drive motor 26 to reverse through the second switch circuit 40 while it allows the first drive motor 17 to stop through the first switch circuit 39 (S5).

Figure 11:
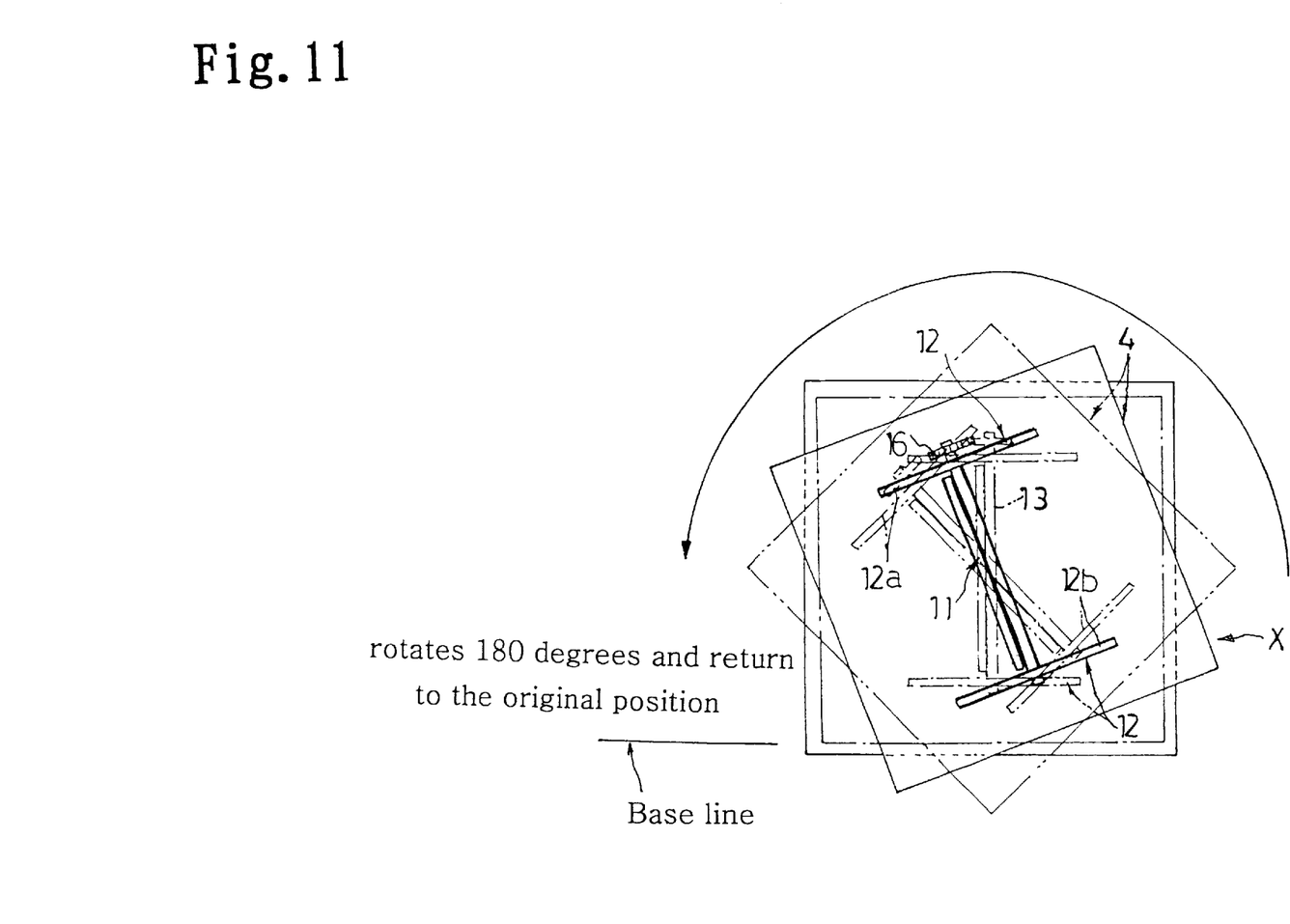
FIG. 11 is an explanation view of the way in which the second drive motor reverses, and a level support stand rotates at 180 degrees and it returns to the original position.

FIG. 11 illustrates a diagram of the way in which the second drive motor 26 reverses, and the level support stand 4 rotates 180 degrees and returns to the original position. At this time, the second drive motor 26 rotates at high-speed. When the level support stand 4 returns to the original position as shown in FIG. 6, the control means 36 allows the second drive motor 26 to stop through the second switch circuit 40 (S6). The first drive motor and second drive motor are stopped through the first and second switch circuit, respectively by operating the control device during the sun's setting. And when it is around 6:00 a.m. in the morning, the above-mentioned operation mode will be repeated again.

Figure 12:
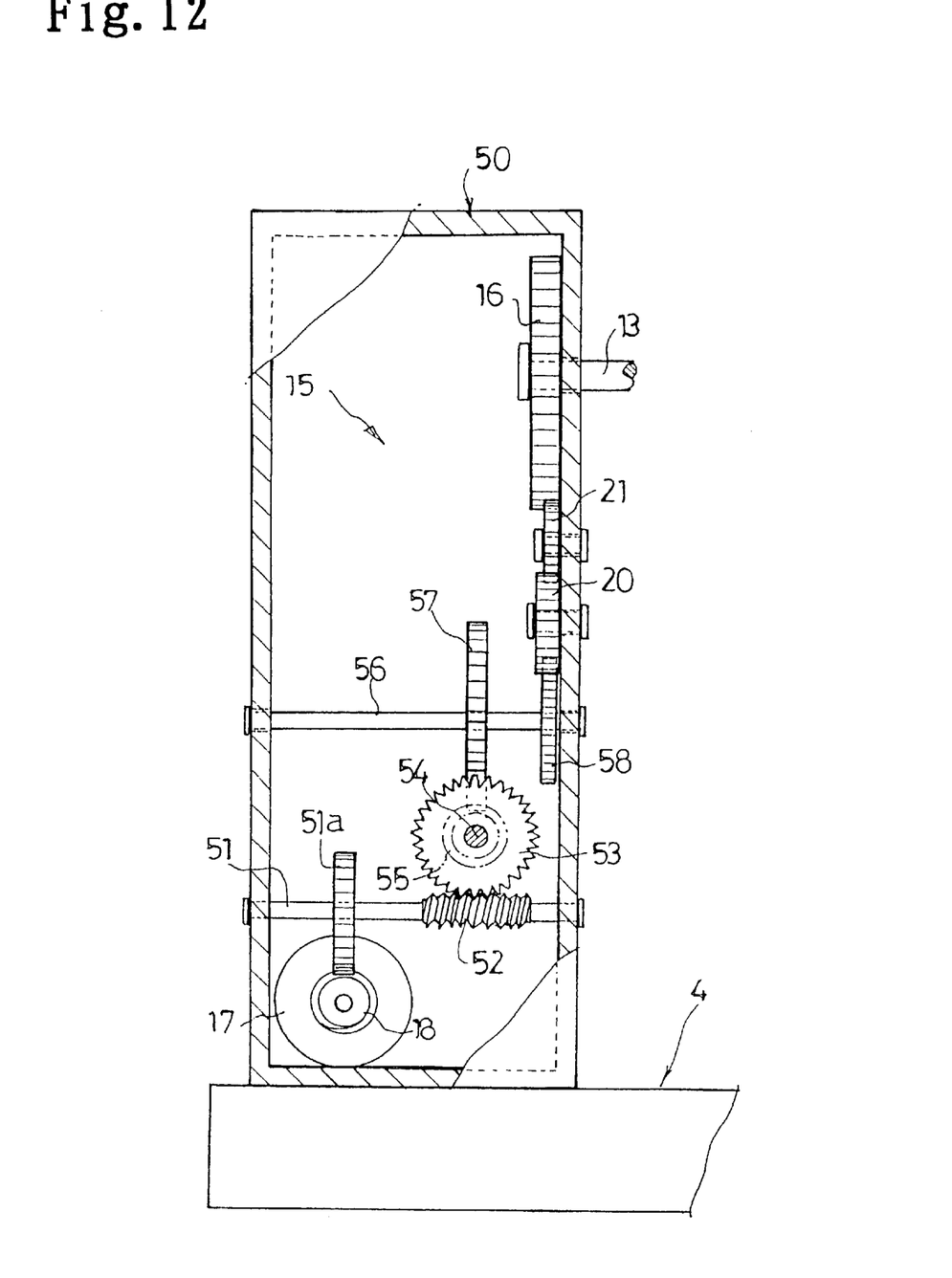
FIG. 12 is an explanation view showing an example of the first drive motor and a set of second deceleration gears.

As an example of the solar cell panel 11, a silicone board with about 1 mm in thickness is used. The axle hole board 12 may be formed in the shape of an end channel. Moreover, the drive motors 17 and 26 and the deceleration gear 15 and 25 may be attached through a suitable attachment box. FIG. 12 illustrates an example of an attachment state of the first drive motor 17 and the second deceleration gear 15.

A gear box 50 is fixed directly or indirectly to the perpendicular board 12a, having the first drive motor 17 provided thereinto. The numeral 18 shows the drive gear fixed to the output axle of the first drive motor 17, gearing with the gear 51a of the first axle 51 supported rotatably into the lower part in the gear box 50. A first worm wheel 52 is provided at the first axle 51, and the first mediation gear 53 meshes to the first worm wheel 52. This first mediation gear 53 is formed in a second axle 54 crossing the first axle 51. The second axle 54 includes a second worm wheel 55 having the same function of the first axle. This second worm wheel 55 has geared with a second mediation gear 57 of a third axle 56 supported rotatably into the gear box 50. Furthermore, the first transmission gear 58 is attached in the end of the third axle 56, and the transmittal power of the first transmission gear 58 is transmitted to the first gear 16 respectively through large and small transmission gears 20 and 21.

Therefore, although not illustrated specifically, the second drive motor 26 and second deceleration gear 25 can be similarly replaced with an L-shaped support board, and can be installed in the second gear box.

What is claimed is:

1. A power generation apparatus using sunlight, allowing a solar cell panel to follow and rotate at a required time so as to chase a movement of the sun and allowing a level support base to rotate at a required time so as to adapt a direction and time of the sun, comprising:

a center support member provided in a standing manner on a base for installation;

a level support base provided fixedly at the center support member;

a solar cell panel provided rotatably at the level support base through a horizontal axle;

a set of deceleration gears interposed between a following gear 16 provided at the horizontal axle so as to move the solar cell panel and a drive gear 18 provided at an output axle of a first drive motor for the panel;

a set of second deceleration gears interposed between a second gear which is provided at the center support member and a second drive gear provided at a drive axle of a second drive motor for the level support base;

means for controlling the first and second drive motors and further including a function for controlling an inclination of the panel, and a function for controlling a turning of the level support base.

2. The power generation apparatus using sunlight according to claim 1, wherein the base for installation includes a plurality of support members having support rollers respectively which support a bottom of an edge of the level support base, wherein the plurality of support members are arranged at a fixed interval on a concentric circle of the center support member.

3. The power generation apparatus using sunlight according to claim 1, wherein the control means allows the first drive motor for the panel and the second drive motor for the level support base to stop through a switch circuit when the sun sets.

* * * * *